(12) United States Patent
Klunder et al.

(10) Patent No.: US 7,468,521 B2
(45) Date of Patent: Dec. 23, 2008

(54) LITHOGRAPHIC APPARATUS AND DEVICE MANUFACTURING METHOD

(75) Inventors: Derk Jan Wilfred Klunder, Geldrop (NL); Levinus Pieter Bakker, Helmond (NL); Vadim Yevgenyevich Banine, Helmond (NL); Frank Jeroen Pieter Schuurmans, Valkenswaard (NL); Dominik Vaudrevange, Aachen (DE); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 415 days.

(21) Appl. No.: 11/319,190

(22) Filed: Dec. 28, 2005

(65) Prior Publication Data

US 2007/0146659 A1    Jun. 28, 2007

(51) Int. Cl.
*G21G 5/00* (2006.01)
*G01J 3/10* (2006.01)
*G03B 27/52* (2006.01)

(52) U.S. Cl. .............................. 250/492.2; 250/504 R; 355/30

(58) Field of Classification Search .................. 355/30, 355/53, 67, 69; 250/492.2, 504 R
See application file for complete search history.

(56) References Cited

U.S. PATENT DOCUMENTS

| | | | | |
|---|---|---|---|---|
| 4,408,338 A | 10/1983 | Grobman | ...................... | 378/34 |
| 4,837,794 A | 6/1989 | Riordan et al. | ............... | 378/119 |
| 6,359,969 B1 | 3/2002 | Shmaenok | .................. | 378/156 |
| 6,459,472 B1 | 10/2002 | De Jager et al. | ............... | 355/68 |
| 6,838,684 B2 * | 1/2005 | Bakker et al. | ............. | 250/492.2 |
| 7,034,308 B2 | 4/2006 | Bakker et al. | .......... | 250/370.08 |
| 7,057,190 B2 | 6/2006 | Bakker et al. | ............. | 250/492.2 |
| 7,106,832 B2 | 9/2006 | Klunder et al. | ............. | 378/156 |
| 7,145,132 B2 | 12/2006 | Bakker et al. | ................ | 250/251 |
| 2004/0184014 A1 | 9/2004 | Bakker et al. | ................. | 355/30 |
| 2006/0012761 A1 | 1/2006 | Bakker et al. | ................. | 355/30 |
| 2006/0138348 A1 | 6/2006 | Bakker | .................... | 250/492.1 |
| 2006/0138362 A1 | 6/2006 | Bakker et al. | ............... | 250/504 |
| 2006/0139604 A1 | 6/2006 | Wassink et al. | ............... | 355/67 |
| 2006/0151717 A1 | 7/2006 | Klunder et al. | ......... | 250/492.2 |
| 2006/0169929 A1 | 8/2006 | Wassink | .................... | 250/504 |
| 2006/0186353 A1 | 8/2006 | Wassink | .................... | 250/492.2 |
| 2006/0219958 A1 | 10/2006 | Wassink | .................... | 250/504 |

(Continued)

FOREIGN PATENT DOCUMENTS

EP    1 274 287 A1    1/2003

(Continued)

*Primary Examiner*—Hung Henry Nguyen
(74) *Attorney, Agent, or Firm*—Pillsbury Winthrop Shaw Pittman, LLP

(57) ABSTRACT

A lithographic apparatus includes a radiation system for providing a beam of radiation. The radiation system includes at least one of a contaminant trap for trapping material emanating from the radiation source and a collector for collecting the beam of radiation. The at least one of the contaminant trap and the collector includes an element arranged in the path of the radiation beam on which the material emanating from the radiation source can deposit during propagation of the radiation beam in the radiation system. At least a part of the element disposed in the path of the radiation beam has a surface that has a highly specular grazing incidence reflectivity to reduce the absorption of the radiation beam in a direction of propagation of the radiation beam substantially non-parallel to the surface of the element, so that a thermal load experienced by the element is reduced.

19 Claims, 10 Drawing Sheets

U.S. PATENT DOCUMENTS

| | | |
|---|---|---|
| 2006/0261290 A1 | 11/2006 | Van Herpen et al. ..... 250/492.2 |
| 2007/0018118 A1 | 1/2007 | Sjmaenok et al. ........ 250/492.2 |
| 2007/0023706 A1 | 2/2007 | Sjmaenok et al. ........... 250/504 |

FOREIGN PATENT DOCUMENTS

| | | |
|---|---|---|
| JP | 9-320792 | 12/1997 |
| JP | 2000-98098 | 4/2000 |
| JP | 2001-57298 | 2/2001 |
| WO | WO 99/42904 | 8/1999 |
| WO | WO 01/37309 A1 | 5/2001 |
| WO | WO 01/99143 A1 | 12/2001 |
| WO | WO 02/054153 A1 | 7/2002 |

\* cited by examiner

1

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To image smaller features, it has been proposed to use extreme ultraviolet radiation (EUV) with a wavelength in the range of 5-20 nanometers, in particular, 13.5 nm, or a charged particle beam, e.g. an ion beam and an electron beam, as the exposure radiation in a lithographic apparatus. These types of radiation need the beam path in the apparatus to be evacuated to avoid absorption. Since there are no known materials for making a refractive optical element for EUV radiation, EUV lithographic apparatus use mirrors in the radiation, illumination, and projection systems. Such mirrors are highly susceptible to contamination, thereby reducing their reflectivity and hence the throughput of the apparatus. Further, sources for EUV may produce debris whose entry into the illumination system should be avoided.

In order to reduce the chance of debris entering the illumination system, the use of contaminant traps are known. Such traps are disposed in the radiation system downstream of the source. The traps comprise elements that provide a surface on which debris can deposit. Conventional radiation systems may also comprise a collector which collects the radiation beam. It has been found that debris may also deposit on elements in the collector. The deposit of debris on the collector significantly reduces its operational lifetime before it must be cleaned.

It is has been found that as the temperature of elements in the contaminant trap increases, the greater the problem of contamination becomes and hence, the shorter the lifetime of the collector becomes. This is because it has been found that at higher temperatures, the elements of the contaminant trap become secondary sources of contamination. In particular, certain debris on the elements is vaporized. The vaporized debris then goes on to further contaminate the collector.

SUMMARY

It is desirable to address the problems encountered in conventional apparatus. In particular, it is desirable to reduce the amount of debris entering the illumination system and to increase the lifetime of the collector.

According to an aspect of the invention, there is provided a lithographic apparatus that includes a radiation system for providing a beam of radiation from radiation emitted by a radiation source. The radiation system includes at least one of a contaminant trap for trapping material emanating from the radiation source and a collector for collecting the beam of radiation. The at least one of the contaminant trap and the collector includes an element arranged in the path of the radiation beam on which the material emanating from the radiation source can deposit during propagation of the radiation beam in the radiation system. At least a part of the element disposed in the path of the radiation beam has a surface that has a highly specular grazing incidence reflectivity to reduce the absorption of the radiation beam in a direction of propagation of the radiation beam substantially non-parallel to the surface of the element, so that a thermal load experienced by the element is reduced. The apparatus also includes an illumination system configured to condition the radiation beam, and a support constructed to support a patterning device. The patterning device is capable of imparting the radiation beam with a pattern in its cross-section to form a patterned radiation beam. The apparatus further includes a substrate table constructed to hold a substrate, and a projection system configured to project the patterned radiation beam onto a target portion of the substrate.

According to an aspect of the invention, there is provided a radiation system for providing a beam of radiation from radiation emitted by a radiation source. The radiation system includes a contaminant trap, and a collector for collecting the beam of radiation. At least one of the contaminant trap and the collector includes an element arranged in the path of the radiation beam for preventing material emanating from the radiation source from propagating beyond the radiation system. At least a part of the element disposed in the path of the radiation beam has a surface that has a highly specular grazing incidence reflectivity to reduce the absorption of the radiation beam in a direction of propagation of the radiation beam substantially non-parallel to the surface of the element, so that a thermal load experienced by the element is reduced.

According to an aspect of the invention, there is provided a device manufacturing method that includes providing a beam of radiation with a radiation system, from radiation emitted by a radiation source, and disposing in the radiation system an element arranged in the path of the radiation beam for preventing material emanating from the radiation source from propagating beyond the radiation system. At least a part of the element disposed in the path of the radiation beam has a surface that has a highly specular grazing incidence reflectivity to reduce the absorption of the radiation beam in a direction of propagation of the radiation beam substantially non-parallel to the surface of the element, so that a thermal load experienced by the element is reduced. The method also includes conditioning the radiation beam, supporting a patterning device, imparting the radiation beam with a pattern in its cross-section using the patterning device to form a patterned radiation beam, holding a substrate on a substrate table, and projecting the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
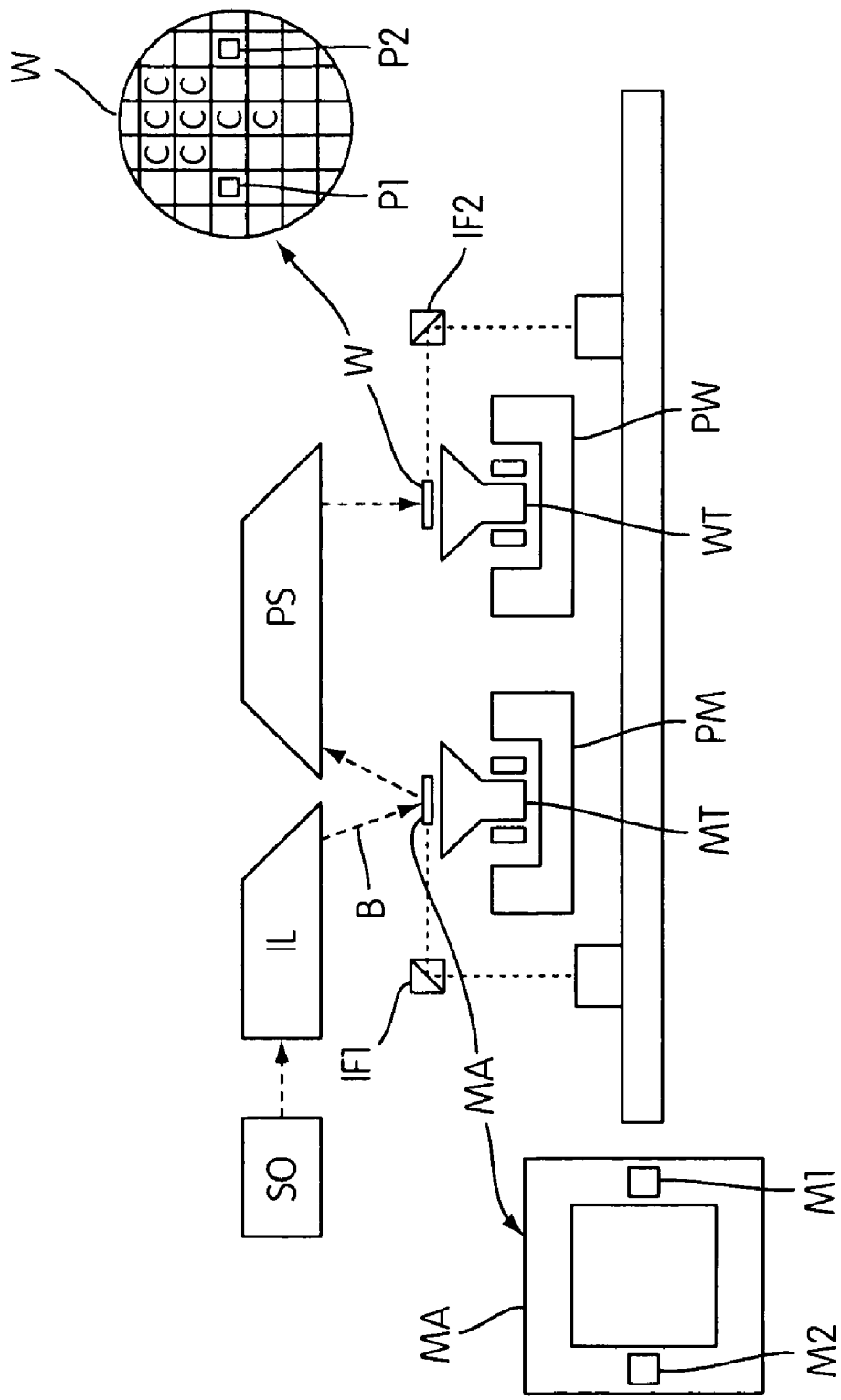
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source SO may be included in a radiation system RS (see FIG. 2). The source and the lithographic apparatus may be separate entities, for example when the source is an excimer laser. In such cases, the source is not considered to form part of the lithographic apparatus and the radiation beam is passed from the source to the illuminator IL with the aid of a beam delivery system comprising, for example, suitable directing mirrors and/or a beam expander. In other cases the source may be an integral part of the lithographic apparatus, for example when the source is a mercury lamp.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
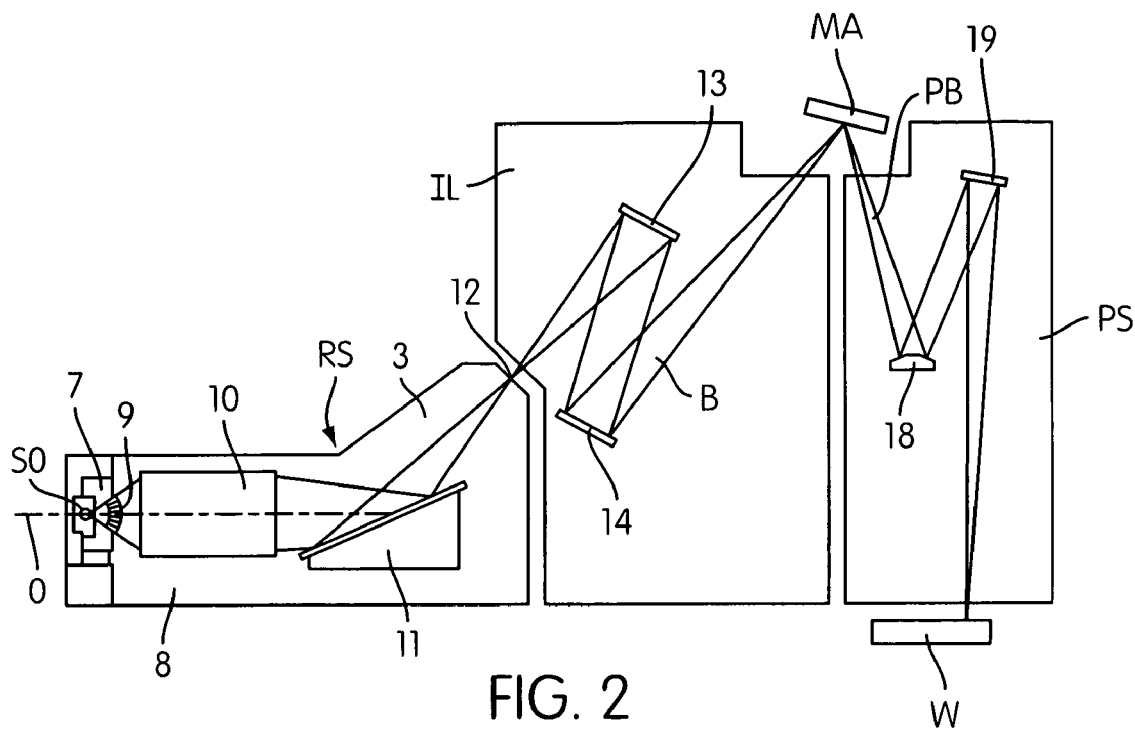
FIG. 2 depicts a side view of an EUV radiation and illumination system and projection optics of a lithographic projection apparatus according to an embodiment of the invention.

FIG. 2 depicts a side view of an EUV radiation and illumination system and projection optics of a lithographic projection apparatus according to an embodiment of the invention. FIG. 2 shows the radiation system RS, the illuminator IL, and the projection system PS. The radiation system RS comprises a source-collector module or radiation unit 3. The radiation unit 3 is provided with a radiation source SO which may be formed by a discharge plasma. EUV radiation source SO may employ a gas or vapor, such as Xe gas or Li vapor. The radiation source SO may also operate on tin. The radiation emitted by the radiation source SO is passed from the source chamber 7 into collector chamber 8 via a contaminant trap or "foil trap" 9. The contaminant trap 9 comprises elements, such as platelets which are provided with a highly reflective surface. The structure of the contaminant trap is discussed in more detail with respect to FIGS. 4 and 5. The collector chamber 8 comprises a radiation collector 10 which may be formed by a grazing incidence collector. Radiation passed by collector 10 is reflected off a grating spectral filter 11 or mirror to be focused in a virtual source point 12 at an aperture in the collector chamber 8. From chamber 8, the projection beam B is reflected through the illuminator IL and the projection system PS via mirrors 13, 14, 18, 19 via the mask MA to the substrate W where the patterned beam PB is incident on the substrate, in the conventional way.

Figure 3:
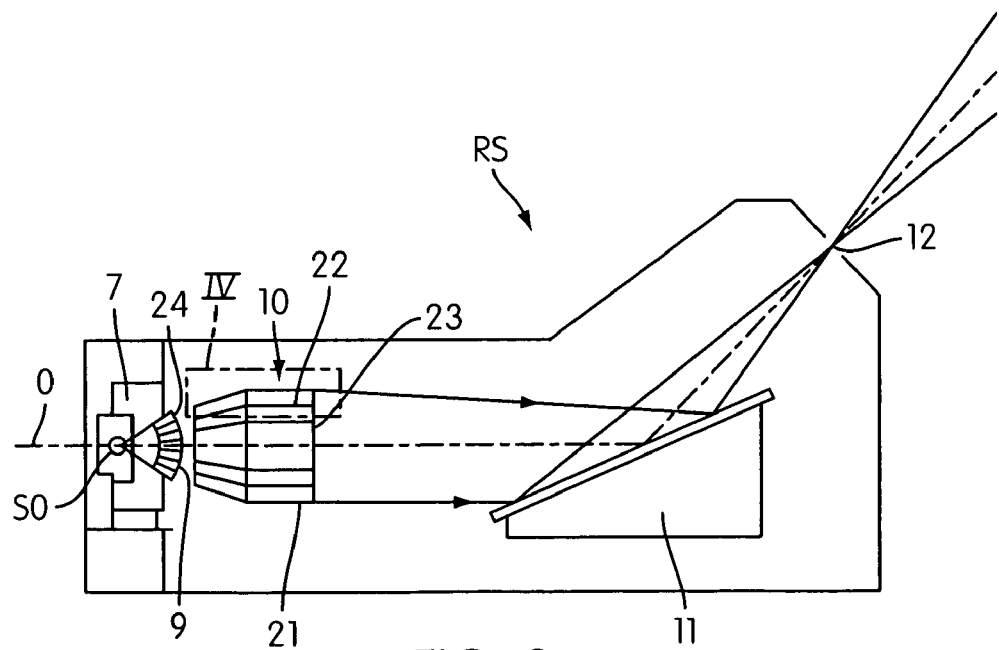
FIG. 3 depicts a detail of the radiation system shown in FIG. 2.

FIG. 3 depicts a detail of the radiation system shown in FIG. 2. As can be seen in FIG. 3, the grazing incidence collector 10 comprises a radiation collector 10. The radiation collector 10 comprises one or more elements 21, 22, 23 having a highly specular reflective surface. In particular, the grazing incidence collector 10 comprises a plurality of nested reflector elements 21, 22, 23. The collector according to embodiments of the present invention is described in more detail with reference to FIGS. 10-12. The contaminant trap 9 comprises one or more elements 24 having a highly specular reflective surface. In particular, the elements 24 are platelets. The platelets 24 are typically made of a metal, for example, molybdenum. The contaminant trap according to an embodiment of the invention is described in more detail with reference to FIGS. 4-9. As set out below, the present invention has application to elements of at least one of the contaminant trap 9 and the collector 10.

Figure 4:
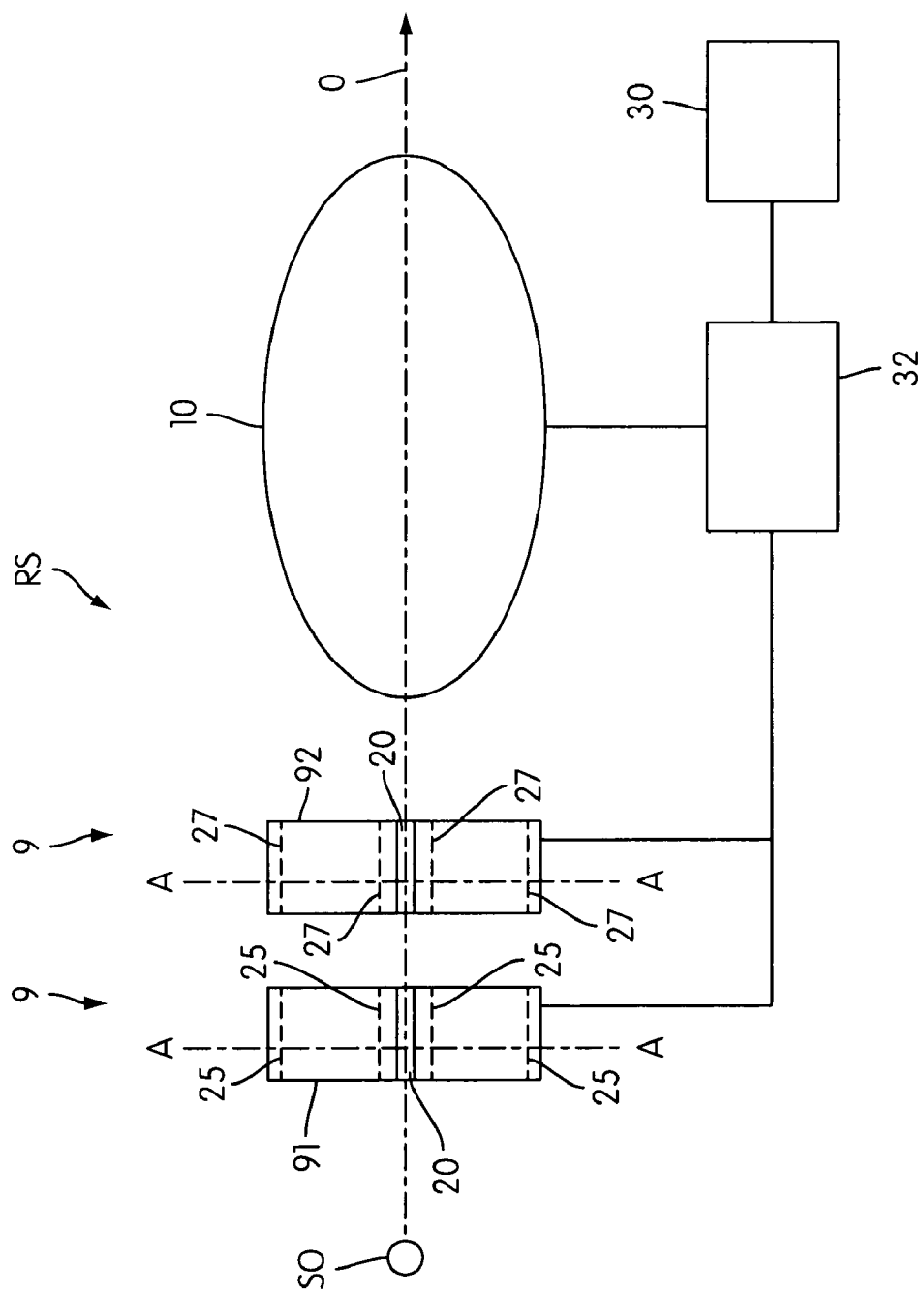
FIG. 4 depicts a detail of a radiation system including a contaminant trap according to an embodiment of the invention.
Figure 5:
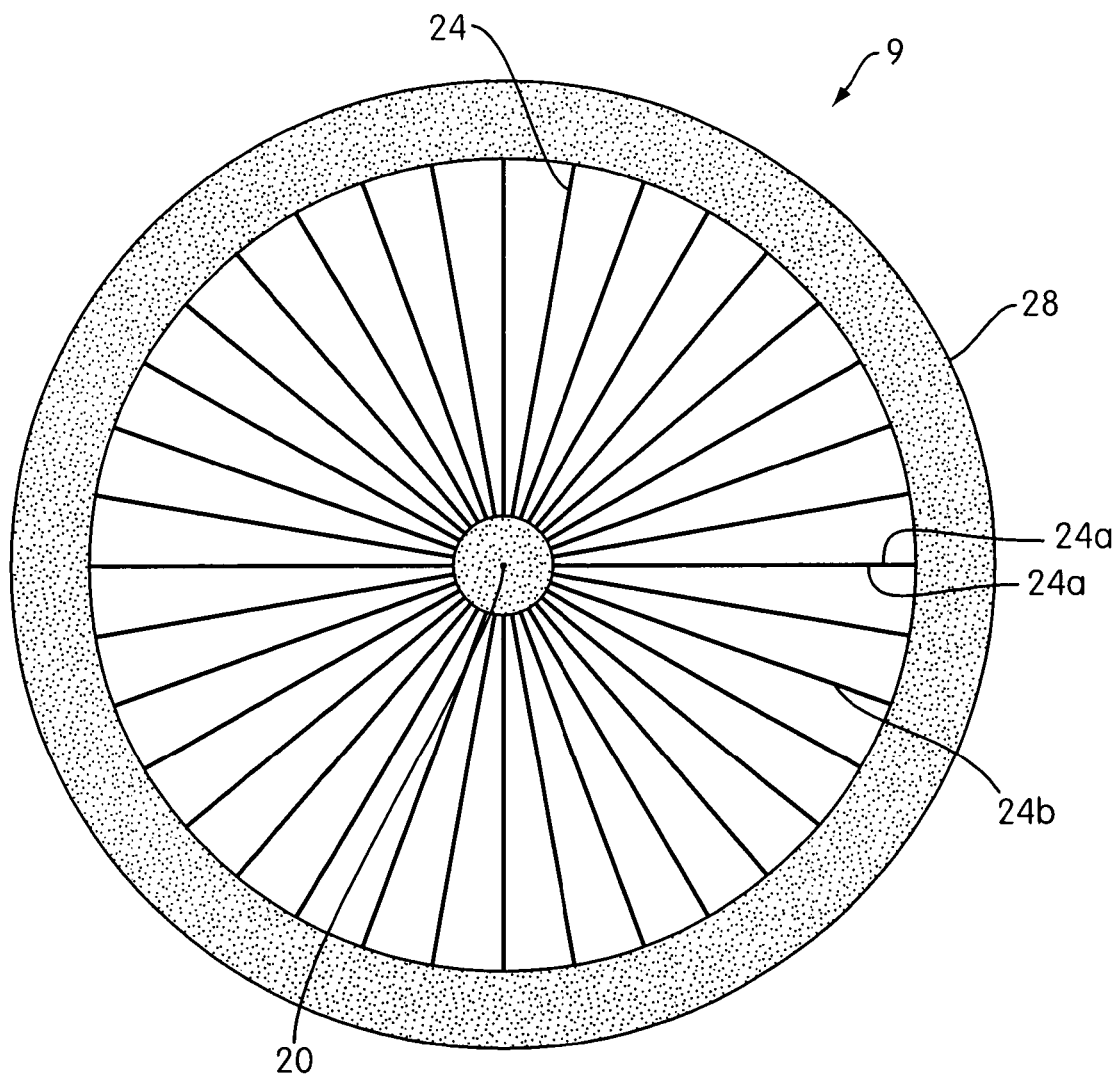
FIG. 5 depicts a cross section of the contaminant trap shown in FIG. 4 through the line A-A of one of the contaminant traps.

FIG. 4 depicts a detail of a radiation system including a contaminant trap according to an embodiment of the invention and FIG. 5 depicts a cross section of the contaminant trap shown in FIG. 4 through either of the lines A-A. The contaminant trap 9 is arranged in the vicinity of the source SO. The trap 9 is constructed to prevent debris, i.e. contaminant material, including particles, thrust by the source SO from reaching the optical components of the radiation system, for example the collector 10 and the illuminator IL. A contaminant trap 9 is shown in cross section in FIG. 4 and in plan view in FIG. 5. The contaminant trap 9 comprises a first set 91 and a second set 92 of platelets 24 (also referred to as foils), which are arranged radially around the optical axis O of the beam B emitted by the source SO. The trap 9 comprises an axis 20 and a support structure 28 between which the platelets 24 are disposed. The platelets 24 of the first and second set 91, 92 define a first set of channels 25 and a second set of channels 27, respectively. For the sake of clarity, in FIG. 4 only two channels of the first set of channels 25 and two channels of the second set of channels 27 are shown. The two sets of channels 25, 27 are spaced. Through the space a flushing gas may be provided. The beam B passes successively through the first set of channels 25 and the second set of channels 27. The platelets 24 are preferably thin to minimize the amount of radiation from the beam absorbed and may be made of metal foil. In one embodiment, the first set of channels 25 are aligned with respect to the second set of channels 27.

According to an embodiment of the invention, the thermal load experienced by the contaminant trap is reduced without having to modify the trap geometry or the positioning of the trap. It has been found that when the temperature of the contaminant trap, in particular, the platelets 24 becomes sufficiently high, the contaminants trapped in the trap are vaporized causing the trap to become a secondary source of contaminants. The invention has particular application to lithographic apparatuses using an EUV source, where the temperatures can be sufficiently high for significant evaporation of contaminants, in particular, tin, from the contaminant trap structures. It has been found that the secondary contamination may become deposited on the collector 10. It has been found that a similar problem arises in the collector 10, where contaminants which may become deposited on the collector 10 may also vaporize thus increasing the chances that the contaminants reach other downstream optics, such as the illuminator IL. It has been found that reduction of the thermal load results in lower contaminant trap temperatures and as a consequence lower flux of contaminant vapor, in particular, tin vapor, towards the collector 10. In this way, according to an embodiment of the invention, the operational life time, that is the lifetime without cleaning, in particular, tin, off the shells of the collector, is increased. It has been found that the operational lifetime of the collector 10 can be increased by at least one order of magnitude by means of reflectivity enhancement. In accordance with an embodiment of the invention, the specular reflection of the platelets 24 is enhanced as a means for reducing the contaminant trap 9 temperature. Increasing the specular reflection on, in particular, a side wall 24a, that is the wall 24a extending into the plane of the paper in FIG. 5 or along the direction of the axis O of the beam in FIG. 4, results in a reduced absorption of radiation directed not parallel to the platelets 24. As a result, the temperature of the contaminant trap is reduced, which results in less secondary contamination. As described in more detail below, according to an embodiment of the invention, the elements 21-24 may comprise a surface on which some metal material, such as tin, is disposed. In order to achieve a highly specular reflective surface, the apparatus may further comprise a thermal control circuit 30 for controlling the temperature of the elements 21-24 to a predetermined temperature at which the metal material forms a liquid layer on at least a part of the surface of the element. In particular, the liquid layer covers substantially the part of the element disposed in the radiation beam. In this way, the diffuse reflection of the radiation beam on the contaminant trap is reduced and the specular reflection is increased. This also results in a reduction of the number of reflections that a beam experiences on average in the contaminant trap and/or collector before it exits the contaminant trap and collector, respectively. In a further embodiment, the thermal control circuit 30 may comprise a heating and cooling element 32 for heating and cooling the elements 21-24 to the predetermined temperature. In this way, the temperature of the elements 21-24 can be accurately controlled to the desired temperature. The desired temperature and the effect of the control of the desired temperature is described in more detail below.

In an alternative embodiment, the highly specular reflective surface of the element 21-24 is achieved by polishing the surface. By polishing the surface of the element and by providing a liquid layer of metal on the surface of the element, the surface roughness of the surface is reduced.

In order to estimate the reflectivity and absorbance of the platelets of the contaminant trap 9, the surface roughness of the molybdenum (Mo) platelets 24 of the contaminant trap 9 was determined and the reflectivity and absorbance with respect to the surface roughness was calculated.

Figure 6:
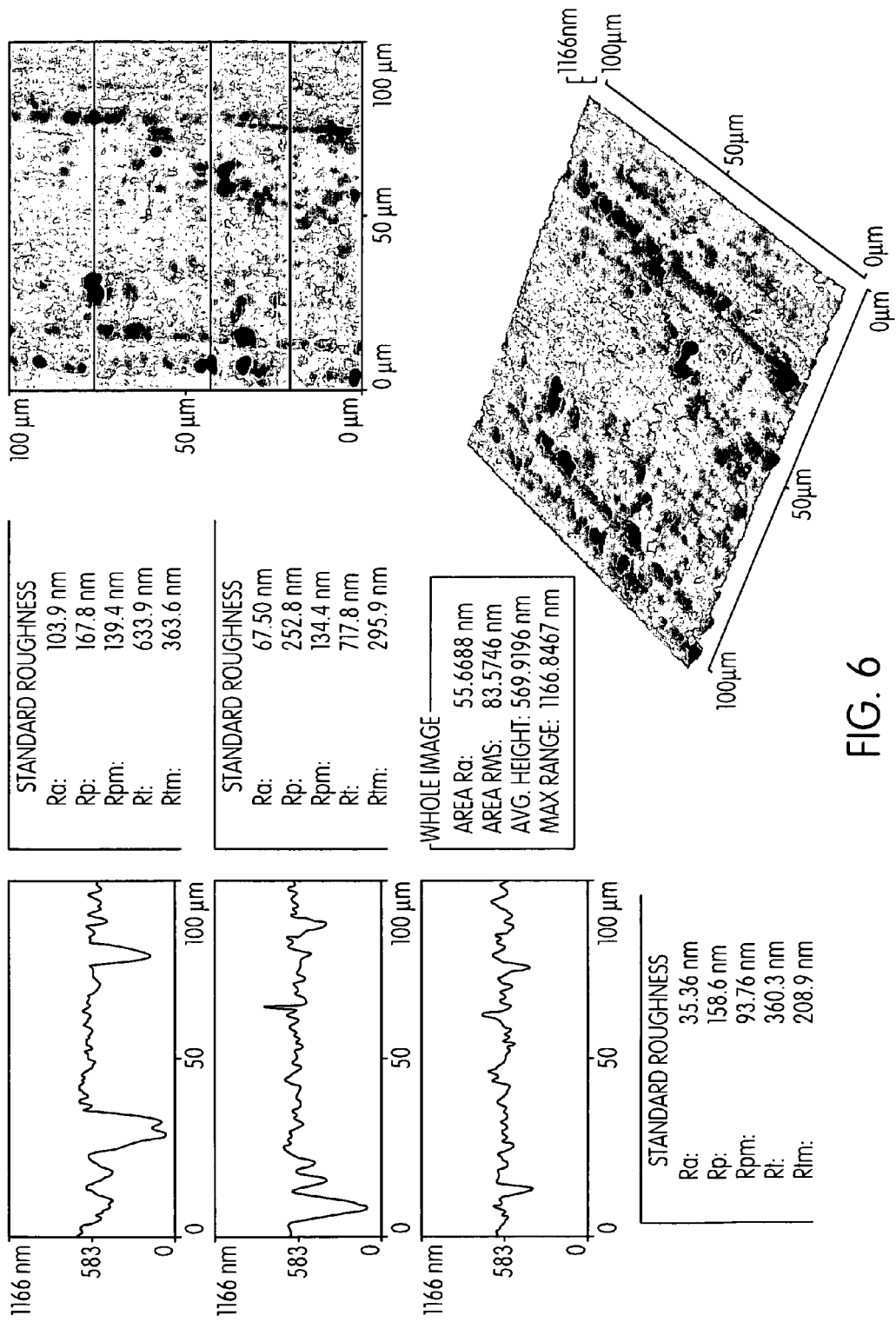
FIG. 6 depicts an area scan of a platelet of a contaminant trap obtained by atomic force microscopy.

FIG. 6 depicts a scan of a platelet of a contaminant trap. In particular, FIG. 6 shows an AFM (atomic force microscope) scan of a typical Mo platelet 24 that is used for the contaminant trap 9 shown in FIGS. 2-5. From the AFM-scan, it can be concluded that the structure is not smooth and has a surface roughness of 70-80 nm.

Figure 7:
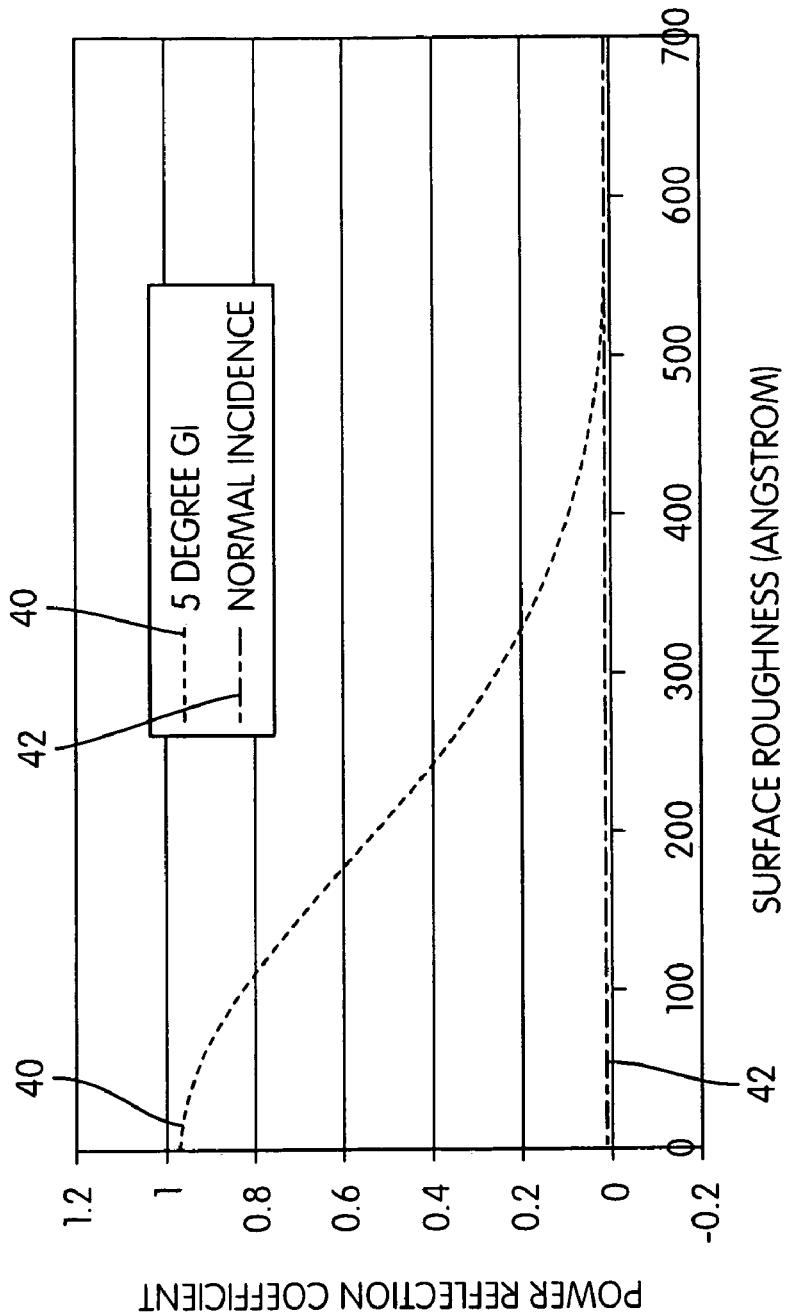
FIG. 7 depicts a graph showing the calculated EUV reflection as a function of surface roughness.

FIG. 7 depicts a graph showing EUV reflection as function of surface roughness. The power reflection coefficient is plotted against the surface roughness in Angstrom. In particular, FIG. 7 shows the impact of surface roughness of the molybdenum platelet 24 on the EUV reflection at 13.5 nm and clearly shows that the GI EUV reflection decreases rapidly, as depicted by curve 40, with increasing surface roughness to virtually zero for a surface roughness of 70 nm while the normal incidence reflection is zero in any case, as shown by straight line 42.

Figure 8:
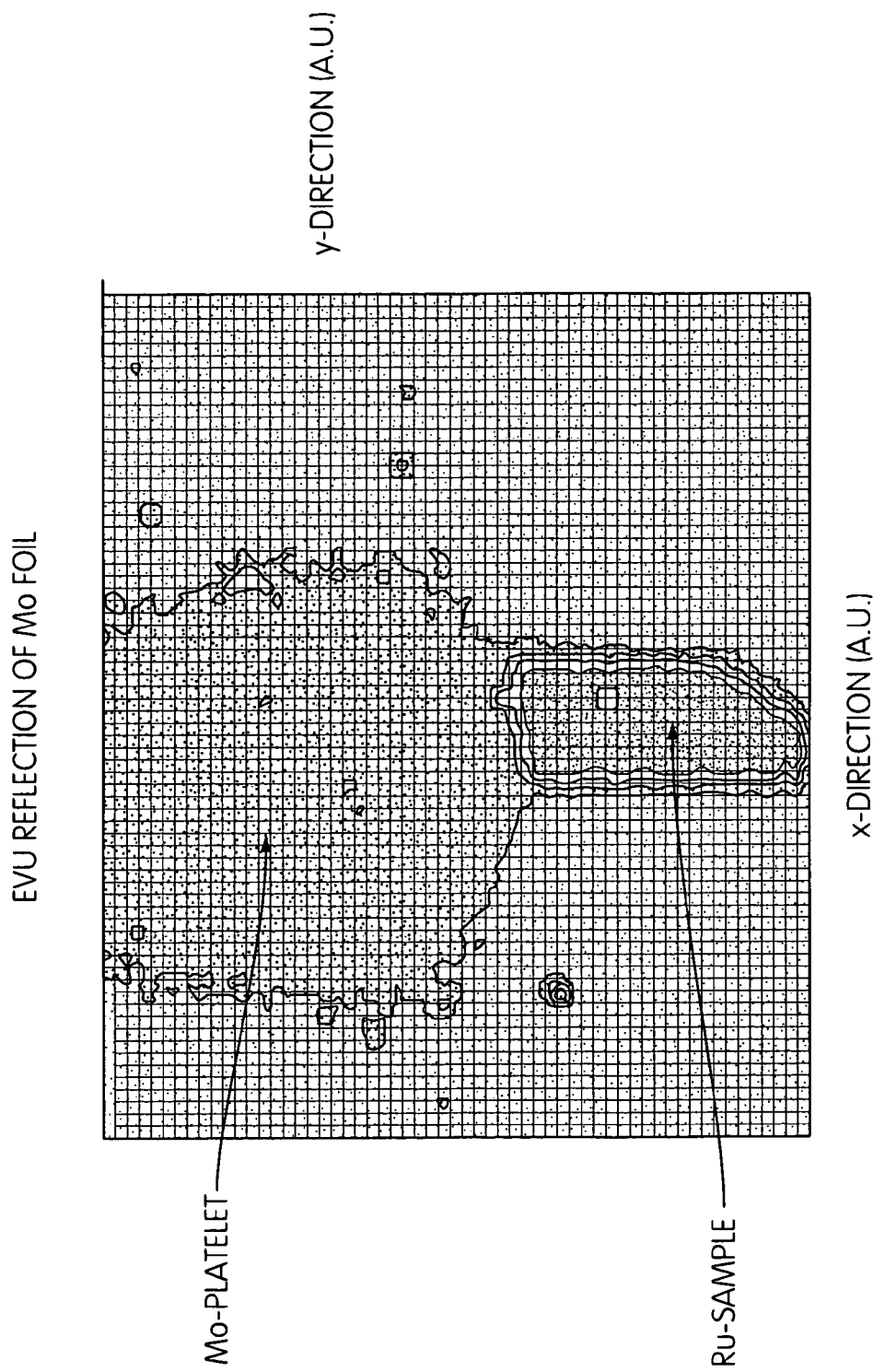
FIG. 8 depicts an image of the EUV reflection for an angle of incidence of 10 degrees and a wavelength of 13.5 nanometers.

In order to distinguish between specular and diffuse reflection, the EUV reflection of a Mo-platelet 24 has been imaged for a grazing angle of incidence of 10 degrees. In particular, FIG. 8 depicts EUV reflection for an angle of incidence of 10 degrees and a wavelength of 13.5 nanometers. FIG. 8 shows that the imaged reflection from the Mo-platelet 24 is significantly wider than the imaged reflection from a ruthenium (Ru) sample. This indicates that there is a large diffuse reflection of EUV radiation from the Mo-platelet 24. From detailed analysis it can be concluded that:

Specular reflection by Mo-platelet is 35%- while total reflection is 66%-indicating that the diffuse reflection at the sides of the platelets 24 is 31% and that 34% of the EUV radiation is absorbed (for a 10 degrees grazing angle).

If it is assumed that specular reflection on a Mo-platelet occurs only once and that a diffusely reflected beam experiences that many reflection that it is eventually completely absorbed, it can be concluded that 65% of the EUV radiation entering the contaminant trap under an angle of 10 degrees with respect to a platelet is absorbed by the contaminant trap.

For calculating the heat load on the sidewalls 24a of the platelets 24, it is reasonable to assume that 65% of the EUV radiation is absorbed.

Based on the above analysis, and with an assumption that the results found for EUV radiation are equally applicable for other wavelengths, it can be concluded that a contaminant trap will absorb 65% of the radiation not parallel to the platelets. The radiation impinging on the front sides of the platelets 24b is almost completely absorbed; no specular reflection for normal incidence angle.

For the heat load on the foil trap due to the source, it can be concluded that:

1. Radiation impinging at the front sides 24b of the contaminant trap is almost completely absorbed.

2. At least 65% of radiation non-parallel to the platelets (e.g., due to deformations) is absorbed by the platelets 24.

The combined effect leads to a temperature increase for the contaminant trap. A high contaminant trap temperature can cause many problems, as mentioned above, such as tin evaporation and reduced debris suppression.

According to an embodiment of the invention, the specular grazing incidence reflectivity on the sidewalls 24a of the platelets is increased, in order to reduce the absorption of radiation non-parallel to the platelets and thus decrease the temperature of the contaminant trap.

As mentioned above, in one embodiment of the invention, the molybdenum platelet 24 is polished. In particular, to a higher degree than conventional platelets. In this way, the absorbance of radiation non-parallel to the platelets is reduced, as a consequence of reduced surface roughness. In this way, the heat load on the contaminant trap may be reduced.

As mentioned above, according to an alternative embodiment, a deposition of thin tin layer on the platelets is envisaged. The Sn layer is deposited to cover the rough surface of the Mo platelet. According to this embodiment, a thin Sn layer is deposited on the platelets during fabrication and subsequently the layer is reflown by heating the platelet to or above the melting temperature of Sn (230° C.). In this way, an interface with lower surface roughness is provided. During EUV illumination, the temperature is high enough for the Sn to be melted (230° C.), resulting in flowing of the Sn layer. Any Sn that deposits on the contaminant trap will be incorporated into this Sn layer, keeping the surface roughness low. Further, should any holes be made in the platelet due to etching of ions, the surface roughness is kept low because the liquid Sn fills any holes. The tin layer may have a thickness in the range of 100 nanometers to 100 micrometers depending on the application. As mentioned above, in order to maintain the platelet at the predetermined temperature, a temperature control circuit which may include a heating and cooling element may be provided.

Figure 9:
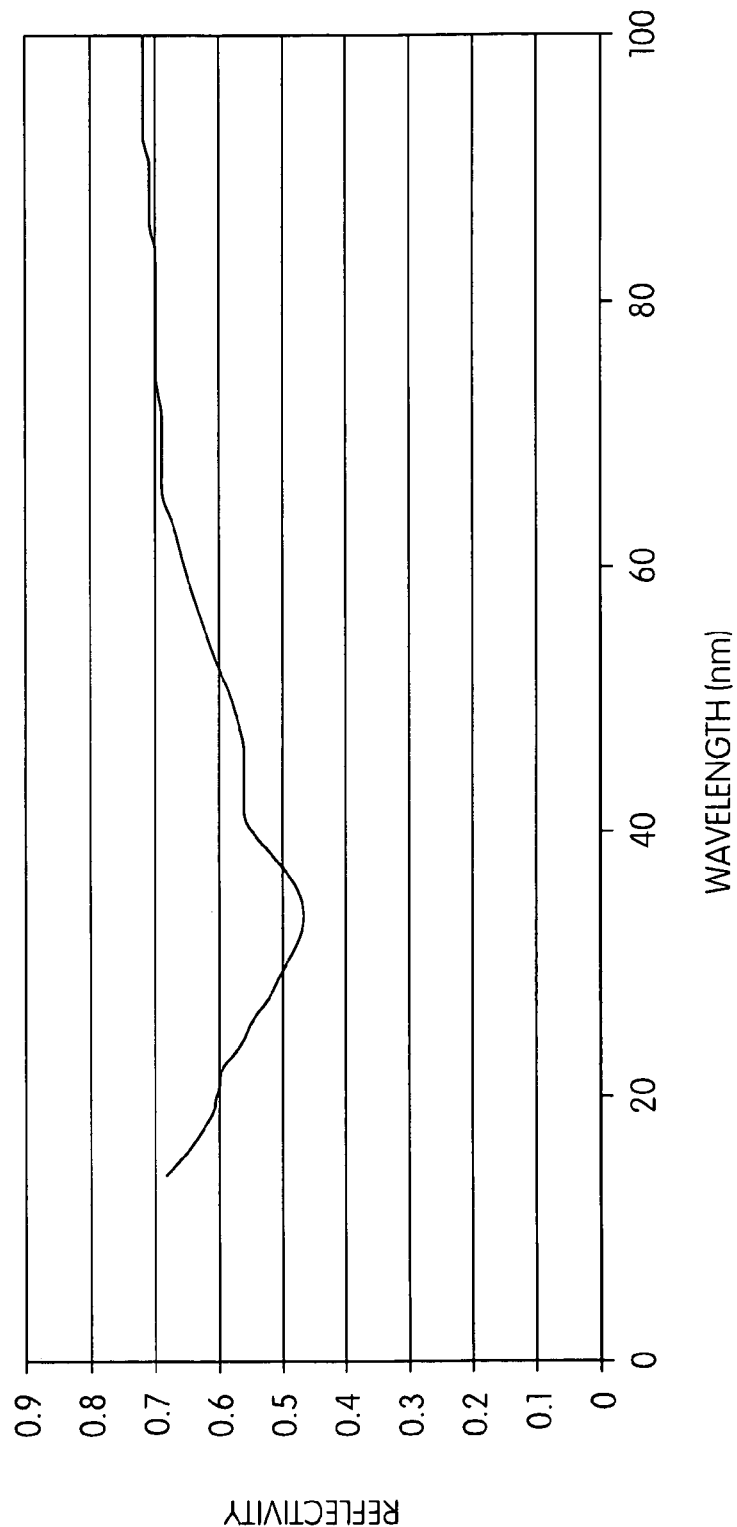
FIG. 9 depicts a graph showing reflection of 5 degrees grazing incidence light on 20 nanometer tin with a surface roughness of 2 nm on a molybdenum substrate.

FIG. 9 depicts a graph showing reflection of 5 degrees grazing incidence light on 20 nm tin with a surface roughness of 2 nm on a molybdenum substrate. In the graph reflectivity is plotted against wavelength in nanometers. FIG. 9 clearly shows that a Sn layer on top of a Mo platelet results in a significantly increased specular reflection. In the graph shown in FIG. 9, a 5 degrees grazing incidence angle and low surface roughness (~2 nm) is assumed.

From FIG. 9, it can be seen that the specular reflection of a Mo-foil covered with Sn is about 70%. This implies a reduction of the absorption of radiation non-parallel to the foils from 65% to 30%.

According to a first order analysis of the temperature of a contaminant trap to be implemented in a lithographic apparatus operating in the EUV wavelength range, in particular, at 13.5 nanometers, the temperature of the contaminant trap is about 900 K. If it is assumed that both the sidewalls 24a of the Mo-platelets and the front ends 24b of the platelets cause 10% absorption, a reduction in absorption by the sidewalls of the platelets from 65% to 30% results in a reduction of the absorbed power from 20% to 14.6%, which corresponds with a contaminant trap temperature of 834 K and an increase of the operational lifetime with more than a factor 20. From these calculations, it is seen that covering the collector with a layer of Sn can considerably increase the operational lifetime of the collector 10.

As mentioned above, in an alternative embodiment, an element of the collector 10 is provided with a highly specular grazing incidence reflectivity. This embodiment is further herein described with reference to FIGS. 10-12.

EUV sources operating purely on tin are envisaged. Tin has the advantage of being able to be cleaned from a surface. Furthermore, because of its low melting temperature, it has been found, as mentioned above, that a liquid coating can be used as a grazing incidence reflector. Another advantage of tin is that tin has a high sticking coefficient on some materials. These properties of tin can be combined into a debris suppression scheme, in a collector 10, for example, a collector to be used in an EUV apparatus. In this embodiment, the collector 10 may comprise a liquid tin surface, which is reflective for EUV radiation at grazing angles. Since the reflection coefficient of tin is not very high for EUV radiation, in one embodiment, a collector 10 is provided having a high grazing reflectivity. The advantage of this arrangement is that at the low pressures the tin-based sources are working, the debris will hit the optical coating of the collector 10, which comprises a surface layer of liquid tin, and hence is regenerative, while the reflection coefficient for EUV radiation is still high. The collector 10 having a conventional Wolter type design, i.e. a nested collector as described with reference to FIGS. 2-4 is disposed downstream of the EUV contaminant trap 9.

Figure 10:
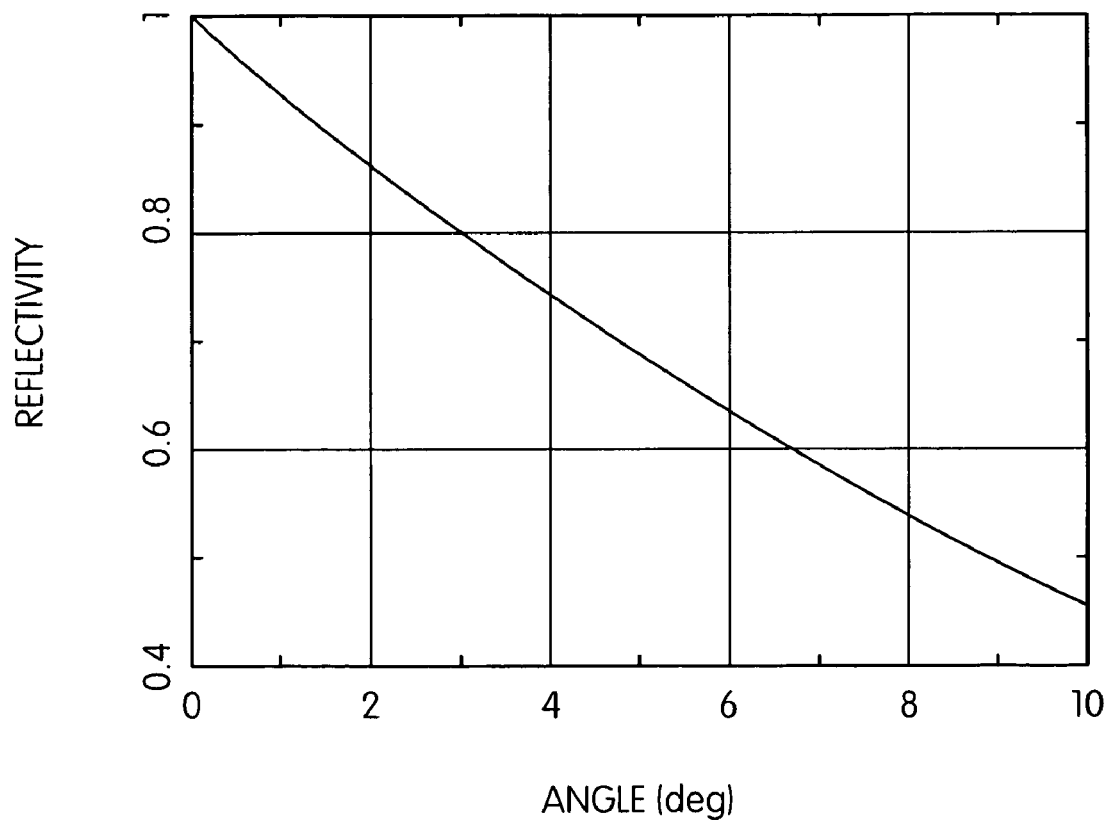
FIG. 10 depicts a graph showing the reflectivity of tin for 13.5 nanometer radiation.

FIG. 10 shows the reflectivity of tin as a function of the grazing angle, for 13.5 nm radiation. As can be seen in FIG. 10, tin reflects 86% of the incident radiation, at a grazing angle of 2 degrees.

In one embodiment, substantially an entire hyperbolic part of the collector 10 may be covered with tin. It is assumed that an elliptical part is free of tin. In which case, its overall, averaged reflectivity decreases from 77% to 40%. Hence the tin results in an extra loss similar to a component of 53% transmission.

Figure 11:
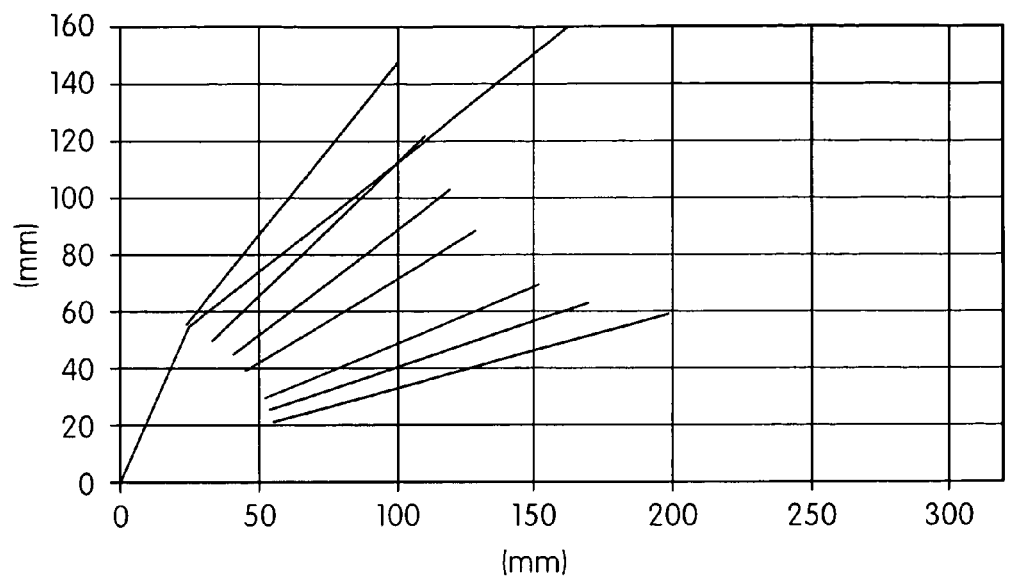
FIG. 11 depicts part of the design of a collector according to an embodiment of the invention.

In a further embodiment, the collector 10 has a nested hyperbola, as shown in FIGS. 2 and 3, wherein the nested hyperbola is reflecting at the inside. A hyperbolic surface 21-23, reflecting at its inner surface, has the property that it creates a virtual source image behind the real source, i.e. in the direction upstream the radiation beam B. This can be seen in FIG. 11. FIG. 11 depicts a part of the design of a collector 10 according to an embodiment of the invention. In FIG. 11, a collector 10 is shown, comprising eight hyperbolic shells 21-23 that collect radiation. The virtual source image emits radiation in the polar angle range from 11 to 45 degrees. The grazing angles are such that the averaged reflectivity is 55% for a Sn optical coating. It is noted that the virtual source image is at approximately −46 mm. The collector 10 creates a magnified source image. The collector 10 can be optimized further by using more shells and other maximum distances to the source. Having more shells results in the possibility to move the virtual source closer to the real one. This is beneficial, since the grazing angles at the optical surfaces will decrease, and the transmission of the collector 10 will increase. The collector 10 may be designed to be rotationally symmetric around the x-axis.

Figure 12:
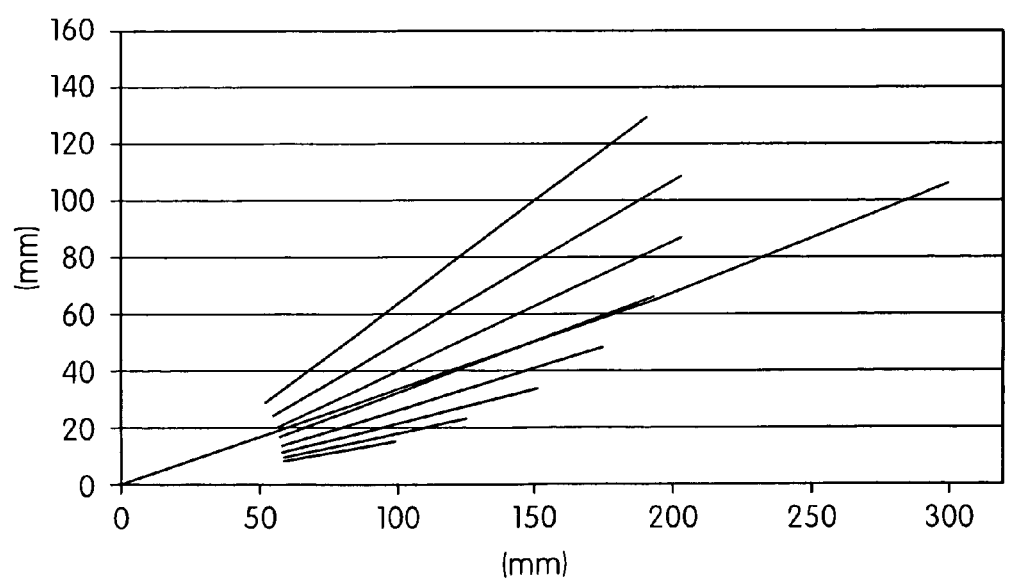
FIG. 12 depicts part of the design of a collector according to a further embodiment of the invention.

In an alternative embodiment, the collector 10 may comprise a nested hyperbola which are reflecting at the outside. This embodiment is similar to the embodiment shown described with reference to FIG. 11, except for the fact that now the outer surfaces of the hyperbola are reflecting. This results in a virtual source positioned in front of the real source, i.e. downstream the projection beam. The virtual source image emits radiation in the polar angle range from 11 to 45 degrees. FIG. 12 depicts a part of the design of a collector 10 according to this alternative embodiment of the invention. The design embodied in FIG. 12 with the reflecting surface on the outside provides the advantage that, since the angles of reflection are smaller, an averaged reflection of 75% is achieved. The virtual source is at approximately +25 mm. Note that this collector creates a demagnified image of the source, thus the collection angles near the source are smaller than behind the collector. Having more shells results in the possibility to move the virtual source closer to the real one. This is beneficial, since the grazing angles at the optical surfaces will decrease, and the transmission of the collector 10 will increase.

All radiation within the collectable solid angle will impinge on the optical surface of the collector 10. The same holds for all the debris resulting from the source volume. Combined with the sticking of Sn, and the regenerative properties of the optical coating, a collector 10 according to an embodiment, functions as a debris resistant contaminant trap, which may be provided in addition or as an alternative to the contaminant trap 9 described hereinabove. In order to wet the collector 10 with tin, the collector 10 can be coated with, for example, copper, or another material that is easily wettable by tin. Furthermore a porous structure can be used to wet the optical coating.

In accordance with the embodiments shown in FIGS. 111 and 12, a grazing incidence collector 10 may be combined with a contaminant trap 9 described hereinabove. The provision of a grazing incidence collector 10 is based on the fact that there is no direct line of sight view through a collector, i.e. both photons and debris particles impinge on the optical coating of the collector 10. By making the optical coating regenerative, i.e. by providing a liquid coating on the collector 10, the contamination will not decrease the optical performance. This collector 10 is relatively closed, and separated from a conventional collector. The transmission of the system is optimized since the angle of incidence on the Sn-covered layers is very small.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultra-violet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a radiation system configured to provide a beam of radiation from radiation emitted by a radiation source, the radiation system comprising a contaminant trap configured to trap material emanating from the radiation source and/or a collector configured to collect the beam of radiation, the contaminant trap and/or the collector comprising an element arranged in the path of the radiation beam on which the material that emanates from the radiation source can deposit during propagation of the radiation beam in the radiation system, at least a part of the element disposed in the path of the radiation beam having a surface that has a highly specular grazing incidence reflectivity to reduce the absorption of the radiation beam in a direction of propagation of the radiation beam substantially non-parallel to the surface of the element, so that a thermal load experienced by the element is reduced;
   an illumination system configured to condition the radiation beam;
   a support constructed to support a patterning device, the patterning device being capable of imparting the radiation beam with a pattern in its cross-section to form a patterned radiation beam;
   a substrate table constructed to hold a substrate; and
   a projection system configured to project the patterned radiation beam onto a target portion of the substrate.

2. A lithographic apparatus according to claim 1, wherein the highly specular grazing incidence reflectivity is configured to cause a reduced number of reflections of the radiation beam on the element as the radiation beam passes through the radiation system.

3. A lithographic apparatus according to claim 1, wherein the reduced thermal load is such that the temperature of the element is prevented from rising to a temperature at which the material deposited on the element is caused to evaporate.

4. A lithographic apparatus according to claim 1, wherein the specular grazing incidence reflectivity of the element is such that absorption of the radiation beam is reduced to cause the temperature of the element to decrease.

5. A lithographic apparatus according to claim 1, wherein the element is one or more platelets comprised in the contaminant trap.

6. A lithographic apparatus according to claim 5, wherein the surface is a sidewall of the platelet that extends in a direction substantially parallel to the direction of propagation of the radiation beam.

7. A lithographic apparatus according to claim 1, wherein the element is a hyperbolic shell comprised in the collector.

8. A lithographic apparatus according to claim 1, wherein the element has a low surface roughness.

9. A lithographic apparatus according to claim 1, wherein the element has a highly polished surface.

10. A lithographic apparatus according to claim 9, wherein the element comprises molybdenum.

11. A lithographic apparatus according to claim 1, wherein the element comprises a surface on which metal material is disposed, the apparatus further comprising a thermal control circuit configured to control the temperature of the element to a predetermined temperature at which the metal material forms a liquid layer on at least a part of the surface of the element.

12. A lithographic apparatus according to claim 11, wherein the liquid layer substantially covers the part of the element disposed in the radiation beam.

13. A lithographic apparatus according to claim 11, wherein the thermal control circuit comprises a heating and cooling element configured to heat and to cool the element to the predetermined temperature.

14. A lithographic apparatus according to claim 11, wherein the metal is tin.

15. A lithographic apparatus according to claim 1, wherein the surface of the element is treated in such a way that the diffusive reflectivity of the surface is suppressed.

16. A radiation system configured to provide a beam of radiation from radiation emitted by a radiation source, the radiation system comprising:
a contaminant trap; and
a collector configured to collect the beam of radiation,
the contaminant trap and/or the collector comprising an element arranged in the path of the radiation beam configured to prevent material that emanates from the radiation source from propagating beyond the radiation system,
at least a part of the element disposed in the path of the radiation beam having a surface that has a highly specular grazing incidence reflectivity to reduce the absorption of the radiation beam in a direction of propagation of the radiation beam substantially non-parallel to the surface of the element, so that a thermal load experienced by the element is reduced.

17. A device manufacturing method comprising:
providing a beam of radiation with a radiation system, from radiation emitted by a radiation source;
disposing in the radiation system an element arranged in the path of the radiation beam for preventing material emanating from the radiation source from propagating beyond the radiation system, at least a part of the element disposed in the path of the radiation beam having a surface that has a highly specular grazing incidence reflectivity to reduce the absorption of the radiation beam in a direction of propagation of the radiation beam substantially non-parallel to the surface of the element, so that a thermal load experienced by the element is reduced;
conditioning the radiation beam;
supporting a patterning device;
imparting the radiation beam with a pattern in its cross-section using the patterning device to form a patterned radiation beam;
holding a substrate on a substrate table; and
projecting the patterned radiation beam onto a target portion of the substrate.

18. A radiation system according to claim 16, wherein the element comprises a surface on which metal material is disposed, the system further comprising a thermal control circuit configured to control the temperature of the element to a predetermined temperature at which the metal material forms a liquid layer on at least a part of the surface of the element.

19. A device manufacturing method according to claim 17, wherein the element comprises a surface on which metal material is disposed, the method further comprising controlling the temperature of the element to a predetermined temperature at which the metal material forms a liquid layer on at least a part of the surface of the element with a thermal control circuit.

* * * * *